United States Patent [19]

Norman et al.

[11] Patent Number: 5,294,975
[45] Date of Patent: Mar. 15, 1994

[54] LASER ALIGNMENT TARGET FOR SEMICONDUCTOR INTEGRATED CIRCUITS

[75] Inventors: Kevin A. Norman, Belmont; Kamlapati Khalsa, San Jose, both of Calif.

[73] Assignee: Altera Corporation, San Jose, Calif.

[21] Appl. No.: 961,598

[22] Filed: Oct. 15, 1992

[51] Int. Cl.⁵ .......................................... G01B 11/00
[52] U.S. Cl. .................................................. 356/401
[58] Field of Search ............................. 356/400, 401; 250/491.1

[56] References Cited

U.S. PATENT DOCUMENTS

| | | | |
|---|---|---|---|
| 3,660,157 | 5/1972 | Villers et al. | 428/174 |
| 4,632,557 | 12/1986 | Thompson | 356/401 |
| 4,824,254 | 4/1989 | Ohtsuka et al. | 356/401 |

OTHER PUBLICATIONS

Patent Abstracts of Japan, vol. 7, No. 186 (E193), Aug. 16, 1983, Abstract of 58-90728.
Patent Abstracts of Japan, vol. 11, No. 190, (E517), Jun. 18, 1987, Abstract of 62-18714.
Patent Abstracts of Japan, vol. 13, No. 251 (E771) Jun. 12, 1989, Abstract of 01-50528.
Patent Abstracts of Japan, vol. 14, No. 187 (E0917) Apr., 16, 1990, Abstract of 02-36523.

Primary Examiner—F. L. Evans
Attorney, Agent, or Firm—Townsend and Townsend Khourie and Crew

[57] ABSTRACT

An alignment target for use in aligning a semiconductor wafer using a scanning light beam includes a light reflective surface of a first material such as aluminum which defines an alignment pattern and a light scattering surface of a second material abutting the light reflective surface, the light scattering surface including a raised pattern of generally orthogonal lines with the lines having inclined sidewalls which scatter impinging light. In a preferred embodiment the second material is polycrystalline silicon which has been etched to form the pattern with inclined sidewalls.

16 Claims, 1 Drawing Sheet

LASER ALIGNMENT TARGET FOR SEMICONDUCTOR INTEGRATED CIRCUITS

BACKGROUND OF THE INVENTION

This invention relates generally to semiconductor integrated circuits, and more particularly the invention relates to a laser alignment target for use in such circuits.

Improvements in semiconductor processing technology have led to increased density of circuit components in large scale integrated circuits. The sizes of transistors and other elements, and the spacing of components, are measured in microns.

Large integrated circuits often employ laser blown fuses for circuit programming and for redundancy repair. The individual fuse elements are typically quite small, similar in size to the transistors, in order to make their use cost effective. Accordingly, the semiconductor wafer must be aligned to very tight tolerances when blowing the fuses.

Heretofore, laser alignment targets on the wafers have comprised a bright central feature against a dark background. Transparent oxide layers have been used to provide a dark background since a layer thickness with a half wavelength (i.e. 0.5, 1.5, 2.5 $\lambda$) of the laser beam will produce wave cancellation for incident light and result in a dark background. However, oxide thickness cannot be accurately controlled and the thickness can vary from lot to lot in production.

Aluminum on oxide has been used to provide the bright reflective central feature. By depositing the aluminum on a flat oxide surface surrounded by a dimpled oxide surface, the reflective central metal can be surrounded by a light scattering metal due to the undulating metal over the dimples. The light scattering surface then provides a dull background. While this technique has been employed in the prior art, contrast between the light reflective metal and the light scattering metal has not been uniform.

The present invention is directed to overcoming limitations of the prior art.

SUMMARY OF THE INVENTION

In accordance with the invention, a grid pattern of light scattering material is provided. The lines of material in the grid have sloped sidewalls which scatter impinging light. As a laser scans the grid pattern, a significant portion of the light is reflected away from the angle of the light detector and the grid pattern appears dark. A bright reflective pattern is provided in abutment with the grid pattern and provides the alignment target. By providing a plurality of targets on a wafer, position and rotation of the wafer can be accurately determined.

In a preferred embodiment, the mesh comprises etched lines of polycrystalline silicon with line width and line spacing no smaller than the wavelength of the laser beam. The reflective pattern is provided by a metal used in an interconnection pattern in the fabrication of the integrated circuit. Contrast between the background of mesh and the reflective metal can be maximized with a noticeable dip in reflected light intensity between the background and the metal of the alignment target.

The invention and objects and features thereof will be more readily apparent from the following detailed description and appended claims when taken with the drawings.

DETAILED DESCRIPTION OF ILLUSTRATIVE EMBODIMENTS

Figure 1:
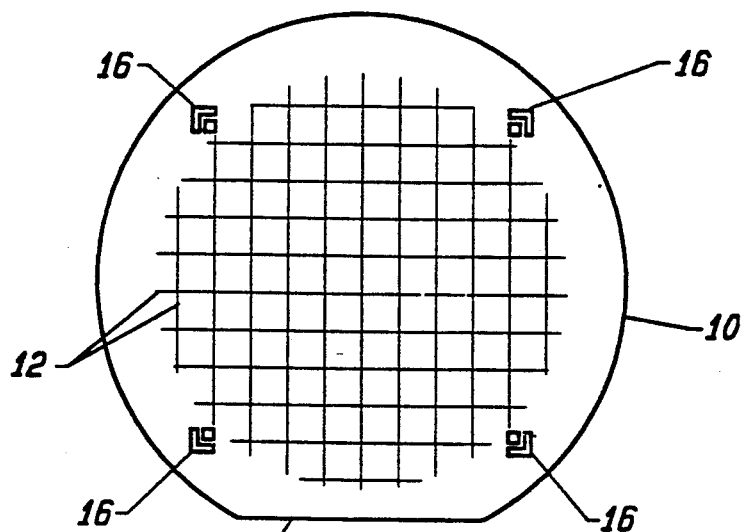
FIG. 1 illustrates a semiconductor wafer including targets in accordance with the invention.

Referring now to the drawings, FIG. 1 is a plan view of a semiconductor wafer 10 having a pattern of integrated circuits formed in a major surface thereof as indicated by the lines 12. The integrated circuits are conventionally formed by the selective introduction of dopants within the crystal structure of the semiconductor wafer 10 and by selectively etching polycrystalline and metal interconnect patterns on the surface of the wafer using conventional photoresist masking and etching techniques.

Heretofore, semiconductor wafers have been aligned in manufacturing fixtures by providing a flat surface 14 on a edge of the wafer which can mate with a guide in the manufacturing fixture. However, as noted above the density of circuit components requires alignment tolerances within a few microns which are not readily provided by a mechanical alignment. Especially when laser blown fuses are incorporated in the integrated circuits, precise and repeatable distance from each fuse element is mandatory. Further, detection of both the position and the rotation of each die must be determined within a minimum position error.

In accordance with the present invention a plurality of laser alignment targets 16, are provided on the surface of the wafer 10 whereby a scanning laser beam can be utilized to determine alignment and rotation of each die. In this illustrative embodiment four targets are utilized on each die surface.

Figure 2:
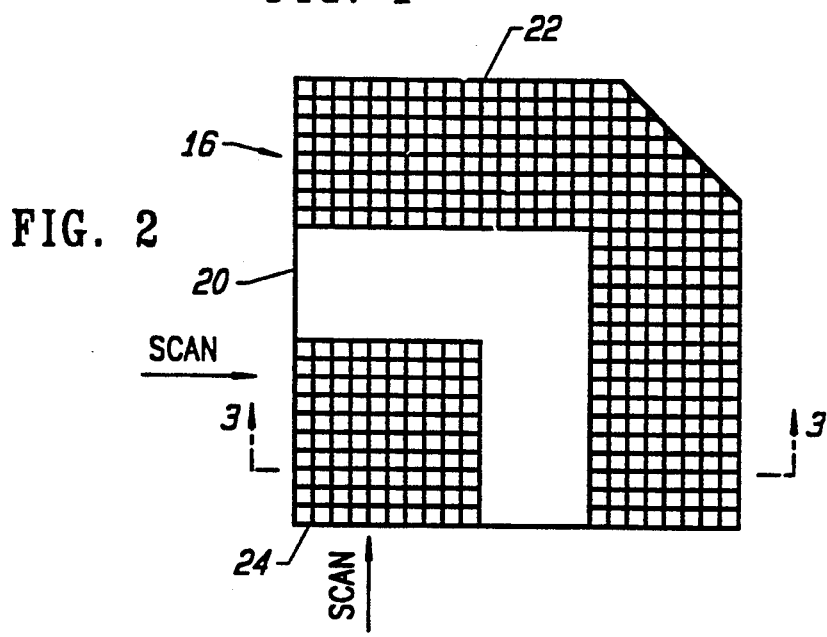
FIG. 2 is a plan view of an alignment target in accordance with one embodiment of the invention.

FIG. 2 is an enlarged view of one of the targets 16. In this embodiment the target includes a generally L shaped reflective surface 20 having opposing edges which abut grid patterns 22 and 24. The reflective surface 20 may comprise aluminum metal which is typically employed in interconnect patterns for an integrated circuit.

The mesh patterns 22, 24 are light scattering surfaces which provide a dark background for the light reflecting material 20. In a preferred embodiment the mesh pattern is formed by etching a polycrystalline silicon layer to provide generally orthogonal lines of uniform width and spacing. The etch creates inclined sidewalls in the etched pattern which provides scattering of impinging light. This is illustrated in the section view of FIG. 3 taken along the line 3—3 in FIG. 2. The polycrystalline silicon layer is illustrated at 30 with the lines 32 formed by conventional photoresist masking and etching techniques with the etch forming the inclined sidewalls 34 in the etched grooves. The aluminum layer 20 is formed on a silicon oxide base 36 with the silicon oxide 36 and the polycrystalline 30 formed on the substrate 10.

The line width and line spacing should be greater than the wavelength, $\lambda$, of the laser beam. The diameter of the laser beam should be sufficiently large to cover several spatial periods or lines simultaneously. Too coarse a spacing of the lines results in bumps in the reflected signal intensity, whereas too fine a spacing (i.e. λ or less) results in a uniform reflection pattern.

Figure 3:
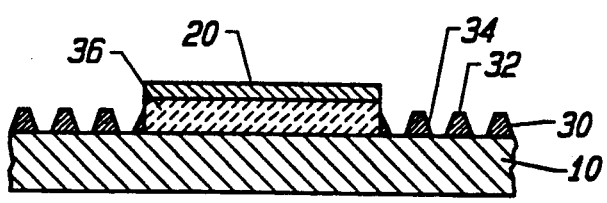
FIG. 3 is a section view of the alignment target of FIG. 2 taken along the line 3—3.
Figure 4:
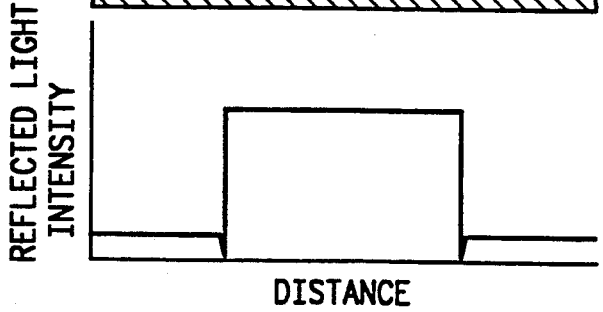
FIG. 4 is a plot of reflected light intensity as a laser beam is scanned across the target of FIG. 2.

FIG. 4 is a plot of reflected light intensity versus distance as a laser beam is scanned across the target of FIG. 2 and 3. Due to the scattering of light the mesh pattern results in a relatively low reflected light intensity, whereas the reflective aluminum layer 20 provide a relatively high reflected light intensity. Advantageously, a perceptible dip in light intensity occurs where the mesh pattern abuts the reflective metal pattern as shown in FIG. 4. Thus, as the laser beam scans across the mesh pattern and reflective pattern as shown in FIG. 2, the edges of the reflective pattern 20 are readily detected not only from the change in light intensity of the mesh and the reflected metal but also from the dip which occurs at the edge of the metal. By scanning the vertical and horizontal edges of each target on the wafer, software in the alignment mechanism can determine the precise center of each target. The presence of a plurality of targets allows this information to resolve the exact position of the wafer, the rotation of the wafer, and calibration of the X and Y dimensions on the wafer.

Fabrication of a laser alignment target in accordance with the invention is compatible with conventional semiconductor wafer fabrication since the reflected pattern can comprise aluminum as used in second level metallization and the mesh pattern can utilize polycrystalline silicon as normally employed in device fabrication. The target in accordance with the invention maximizes contrast between the reflective surface and the background mesh surface with the edges therebetween well defined by dips in the reflected light intensity.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. An alignment target for use in aligning a semiconductor wafer using a scanning light beam comprising a light reflective surface of a first material defining an alignment pattern, and a light scattering surface of a second material abutting said light reflecting surface, said light scattering surface including a raised pattern of generally orthogonal lines formed in said second material, each line having inclined sidewalls which scatter impinging light.

2. The alignment target as defined by claim 1 wherein said raised pattern has uniform line width and line spacing.

3. The alignment target as defined by claim 1 wherein said scanning light beam is a laser beam having a wavelength, λ, said line width and said line spacing being greater than λ.

4. The alignment target as defined by claim 3 wherein said laser beam has a diameter whereby said laser beam impinges on a plurality of lines simultaneously.

5. The alignment target as defined by claim 4 wherein said first material comprises aluminum and said second material comprises polycrystalline silicon.

6. The alignment target as defined by claim 5 wherein said polycrystalline silicon is etched to form said raised pattern with inclined sidewalls.

7. The alignment target as defined by claim 6 wherein said alignment pattern is L shaped, said light scattering surface abutting opposing edges of said alignment pattern.

8. The alignment target as defined by claim 1 wherein said first material comprises aluminum and said second material comprises polycrystalline silicon.

9. The alignment target as defined by claim 8 wherein said polycrystalline silicon is etched to form said raised pattern with inclined sidewalls.

10. The alignment target as defined by claim 9 wherein said alignment pattern is L shaped, said light scattering surface abutting opposing edges of said alignment pattern.

11. A work piece comprising a semiconductor wafer having a major surface, a plurality of integrated circuits formed in said major surface, and a plurality of alignment targets for determining position and rotation of said semiconductor wafer relative to a scanning light beam, each alignment target including a light reflective surface of a first material defining an alignment target, and a light scattering surface of a second material abutting said light reflecting surface, said light scattering surface including a raised pattern of generally orthogonal lines formed in said second material, each line having inclined sidewalls which scatter impinging light.

12. The work piece as defined by claim 11 wherein said raised pattern has uniform line width and line spacing.

13. The work piece as defined by claim 11 wherein said scanning light beam is a laser beam having a wavelength, λ, said line width and said line spacing being greater than λ, said laser beam having a diameter whereby said laser beam impinges on a plurality of lines simultaneously.

14. The work piece as defined by claim 11 wherein said first material comprises aluminum and said second material comprises polycrystalline silicon.

15. The work piece as defined by claim 14 wherein said polycrystalline silicon is etched to form said pattern with inclined sidewalls.

16. The work piece as defined by claim 15 wherein said alignment pattern is L shaped, said light scattering surface abutting opposing edges of said alignment pattern.

* * * * *